United States Patent
Morita et al.

(10) Patent No.: US 12,080,444 B2
(45) Date of Patent: Sep. 3, 2024

(54) CONDUCTIVE COMPOSITE MATERIAL

(71) Applicant: Murata Manufacturing Co., Ltd., Nagaokakyo (JP)

(72) Inventors: Hiroyuki Morita, Nagaokakyo (JP); Kosuke Sugiura, Nagaokakyo (JP); Masanori Abe, Nagaokakyo (JP); Akari Seko, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 0 days.

(21) Appl. No.: 18/158,154

(22) Filed: Jan. 23, 2023

(65) Prior Publication Data

US 2023/0154642 A1    May 18, 2023

Related U.S. Application Data

(63) Continuation of application No. PCT/JP2021/028610, filed on Aug. 2, 2021.

(30) Foreign Application Priority Data

Aug. 3, 2020    (JP) ................ 2020-131866

(51) Int. Cl.
*H01B 1/20* (2006.01)
*B05D 5/12* (2006.01)
(Continued)

(52) U.S. Cl.
CPC ............... *H01B 1/22* (2013.01); *B05D 5/12* (2013.01); *H01B 1/24* (2013.01)

(58) Field of Classification Search
CPC .... H01B 1/06; H01B 1/20; H01B 5/16; B05D 5/12
See application file for complete search history.

(56) References Cited

U.S. PATENT DOCUMENTS

| | | | |
|---|---|---|---|
| 11,246,247 B2 * | 2/2022 | Choi | H05K 9/0083 |
| 2020/0015391 A1 * | 1/2020 | Lee | H05K 9/0084 |
| 2020/0405165 A1 | 12/2020 | Vitale et al. | |

FOREIGN PATENT DOCUMENTS

| | | | |
|---|---|---|---|
| CN | 110698847 A | * | 1/2020 |
| CN | 111171703 A | | 5/2020 |
| WO | 2019055784 A1 | | 3/2019 |

OTHER PUBLICATIONS

Kong et al "Further surface modification by carbon coating for in-situ growth of Fe3O4 nanoparticles on MXene Ti3C2 multilayers . . . ", Electrochimica Acta 289 (2018) 228-237.*

(Continued)

*Primary Examiner* — Mark Kopec
(74) *Attorney, Agent, or Firm* — ArentFox Schiff LLP

(57) ABSTRACT

A conductive composite material that includes: particles of a layered material including one or plural layers, wherein the one or plural layers include a layer body represented by: $M_m X_n$, where M is at least one metal of Group 3, 4, 5, 6, or 7, X is a carbon atom, a nitrogen atom, or a combination thereof, n is not less than 1 and not more than 4, m is more than n but not more than 5, and a modifier or terminal T exists on a surface of the layer body, where T is at least one of a hydroxyl group, a fluorine atom, a chlorine atom, an oxygen atom, or a hydrogen atom; and a polymer material that includes a hydrogen acceptor and a hydrogen donor, a ratio of the particles of the layered material is more than 19% by volume but not more than 95% by volume.

16 Claims, 5 Drawing Sheets

(51) Int. Cl.
    *H01B 1/22* (2006.01)
    *H01B 1/24* (2006.01)

(56) References Cited

OTHER PUBLICATIONS

Qian et al "Fabrication of urchin-like ZnO-MXene nanocomposites for high-performance electromagnetic absorption", Ceramics International 43 (2017) 10757-10762.*
Zhang et al "Cu2O hybridized titanium carbide with open conductive frameworks for lithium-ion batteries", Electrochemica Acta 202 (2016) 24-31.*
Yoon et al "Low-dimensional carbon and MXene-based electrochemical capacitor electrodes", Nanotechnology 27 (2016) 172001 (21pp).*
Ronchi et al "Thermoplastic polyurethane-Ti3C2(Tx) MXene nanocomposite . . . ", Applied Surface Science 528 (2020) 146526.*
Sheng et al "Properties of two-dimensional Ti3C2 MXene/thermoplastic polyurethane nanocomposites . . . ", Composites Science and Technology 181 (2019) 107710.*
International Search Report in PCT/JP2021/028610, mailed Oct. 19, 2021, 3 pages.
Han et al., "Ti3C2 MXenes with Modified Surface for High-Performance Electromagnetic Absorption and Shielding in the X-Band," ACS Appl. Mater. Interfaces, 2016, vol. 8, pp. 21011-21019.
Ling et al., "Flexible and conductive MXene films and nanocomposites with high capacitance," PNAS, Nov. 25, 2014, vol. 111, No. 47, pp. 16676-16681.
Shahzad et al., "Electromagnetic interference shielding with 2D transition metal carbides (MXenes)," Science, Sep. 9, 2016, vol. 353, Issue 6304, pp. 1137-1140.
Wang et al., "Fabrication on the annealed Ti3C2Tx MXene/Epoxy nanocomposites for electromagnetic interference shielding application," Composites Part B, 2019, vol. 171, pp. 111-118.
Yu et al., "Interface decoration of exfoliated MXene ultra-thin nanosheets for fire and smoke suppressions of thermoplastic polyurethane elastomer," Journal of Hazardous Materials, 2019, vol. 374, pp. 110-119.
Zhi et al., "Study of MXene-filled polyurethane nanocomposites prepared via an emulsion method," Composites Science and Technology, 2018, vol. 168, pp. 404-411.

\* cited by examiner

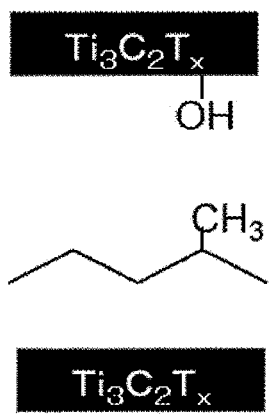 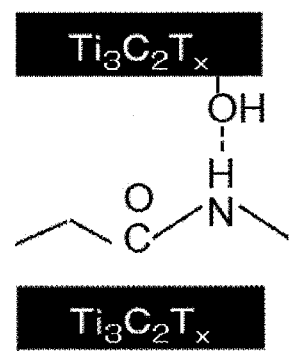 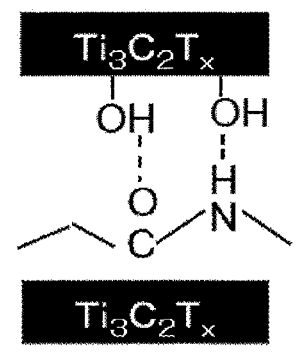
*Fig. 3*(a)  *Fig. 3*(b)  *Fig. 3*(c)

CONDUCTIVE COMPOSITE MATERIAL

CROSS REFERENCE TO RELATED APPLICATIONS

The present application is a continuation of International application No. PCT/JP2021/028610, filed Aug. 2, 2021, which claims priority to Japanese Patent Application No. 2020-131866, filed Aug. 3, 2020, the entire contents of each of which are incorporated herein by reference.

FIELD OF THE INVENTION

The present invention relates to a conductive composite material.

BACKGROUND OF THE INVENTION

In recent years, MXene has been attracting attention as a new material having an electrical conductivity. MXene is a type of so-called two-dimensional material, and as will be described later, is a layered material in a form of one or plural layers. In general, MXene is in a form of particles (which can include powders, flakes, nanosheets, and the like) of such a layered material.

Hitherto, for the purpose of improving strength, flexibility, and the like, a composite material of MXene and a polymer has been prepared. For example, Non Patent Literature 1 discloses that $Ti_3C_2T_x$ as MXene is mixed with polyvinyl alcohol (PVA) to form a composite film, and thus the flexibility and mechanical strength was ensured while maintaining the electrical conductivity. Non Patent Literature 2 discloses a composite film of MXene: $Ti_3C_2T_x$ and sodium alginate (SA), as a material having high flexibility and electrical conductivity for the purpose of achieving EMI shielding of thin films.

Non Patent Literature 3 discloses EMI shielding nanocomposites containing up to 15 mass % of $Ti_3C_2T_x$ as MXene and epoxy, in order to ensure the electrical conductivity and EMI shielding effectiveness. Non Patent Literature 3 discloses that annealing of the nanocomposites results in removal of partial polar groups on the surface of $Ti_3C_2T_x$, without a by-product, and the annealed nanocomposites exhibit relatively higher electrical conductivity, excellent EMI shielding effectiveness (SE), and appropriate hardness.

Non Patent Literature 4 discloses electromagnetic (EM) absorbing and shielding composite materials in which $Ti_3C_2$ MXenes are present in a wax matrix and which composite materials were processed with annealing treatment.

Non Patent Literature 5 discloses composite materials in which two-dimensional MXene was filled into polyurethane (PU) by using an emulsion method. In addition, Non Patent Literature 5 discloses that the addition of 0.5 mass % MXene increases the yield stress, tensile strength and hardness of polyurethane.

Non Patent Literature 6 discloses composite materials of $Ti_3C_2$ (MXene) ultra-thin nanosheets modified with cetyltrimethylammonium bromide (CTAB) and tetrabutyl phosphine chloride (TBPC); and polyurethane, as flame retardants using thermoplastic polyurethane (TPU).

Non Patent Literature 1: Zheng Ling, et al., "Flexible and conductive MXene films and nanocomposites with high capacitance," Proceedings of the National Academy of Sciences, 2014, vol. 11, pp. 16676-16681

Non Patent Literature 2: Faisal Shahzad, et al., "Electromagnetic interference shielding with 2D transition metal carbides (MXenes)," Science, 2016, vol. 353, pp. 1137-1140

Non Patent Literature 3: Lei Wang, et al., "Fabrication on the annealed $Ti_3C_2Tx$ MXene/Epoxy nanocomposites for electromagnetic interference shielding application," Composites Part B, 2019, vol. 171, pp. 111-118

Non Patent Literature 4: Meikang Han, et al., "$Ti_3C_2$ MXenes with Modified Surface for High-Performance Electromagnetic Absorption and Shielding in the X-Band," ACS Applied Materials Interfaces, 2016, vol. 8, pp. 21011-21019

Non Patent Literature 5: Weigiang Zhi, et al., "Study of MXene-filled polyurethane nanocomposites prepared via an emulsion method," Composites Science and Technology, 2018, vol. 168, pp. 404-411

Non Patent Literature 6: Bin Yu, et al., "Interface decoration of exfoliated MXene ultra-thin nanosheets for fire and smoke suppressions of thermoplastic polyurethane elastomer," Journal of Hazardous Materials, 2019, vol. 374, pp. 110-119

SUMMARY OF THE INVENTION

Among the MXene/polymer composite materials shown in Non Patent Literatures 1 to 6, the composite film of $Ti_3C_2T_x$ and PVA in Non Patent Literature 1 has a high content of $Ti_3C_2T_x$ of 90 mass %, but the electrical conductivity is greatly reduced to $\frac{1}{10}$ or less of that of a pure $Ti_3C_2T_x$ film.

The EMI shielding nanocomposite materials containing up to 15 mass % of $Ti_3C_2T_x$ and epoxy, shown in Non Patent Literature 3, are hardly deformed when a load is applied, and thus have appropriate hardness. However, the electrical conductivity is 0.38 S/cm at the maximum. It is significantly lower than the electrical conductivity of pure MXene film, which is several thousand S/cm. In addition, the composite materials in which $Ti_3C_2$ (MXenes) are present in a wax matrix in Non Patent literature 4 have an excellent electromagnetic (EM) absorbing capacity, but have an electrical conductivity of about 0.001 S/cm at the highest, which is significantly lower than the electrical conductivity of a pure MXene film.

Although the composite materials of MXene and polyurethane in Non Patent Literatures 5 and 6 exhibit high yield stress, tensile strength, and hardness, it is presumed that the composite materials exhibit insulating properties, and the electrical conductivity is considered to be significantly low.

Meanwhile, it is considered that the composite film of MXene and sodium alginate (SA) in Non Patent Literature 2 exhibits an electrical conductivity of 2963 S/cm (in the case of $Ti_3C_2T_x$ of 90 mass %) at the maximum, but has low strength.

As described above, the current composite materials of MXene and polymer cannot achieve both high electrical conductivity and high strength. The present invention has been made in view of the above circumstances, and an object of the present invention is to provide a composite material of MXene and a polymer material which can achieve both high electrical conductivity and high strength.

According to one gist of the present invention, provided is a conductive composite material comprising: particles of a layered material including one or plural layers, wherein the one or plural layers include a layer body represented by: $M_mX_n$, where M is at least one metal of Group 3, 4, 5, 6, or 7, X is a carbon atom, a nitrogen atom, or a combination thereof, n is not less than 1 and not more than 4, and m is more than n but not more than 5, and a modifier or terminal T exists on a surface of the layer body, where T is at least one selected from the group consisting of a hydroxyl group, a fluorine atom, a chlorine atom, an oxygen atom, or a hydrogen atom; and a polymer material that includes a hydrogen acceptor that is at least one selected from the group consisting of a fluorine atom, a chlorine atom, an oxygen atom, or a nitrogen atom; and a hydrogen donor that is a hydroxyl group and/or a secondary amino group, and wherein a ratio of particles of the layered material is more than 19% by volume but not more than 95% by volume.

According to the present invention, provided is a conductive composite material comprising: particles of a predetermined layered material (also referred to as "MXene" in the present specification); and a polymer material, in which the polymer material includes, as a hydrogen acceptor, at least one selected from the group consisting of a fluorine atom, a chlorine atom, an oxygen atom, or a nitrogen atom, and includes, as a hydrogen donor, a hydroxyl group and/or a secondary amino group, and a ratio of particles of the layered material is more than 19% by volume but not more than 95% by volume, and thus the composite material includes MXene and can achieve both high electrical conductivity and high strength.

BRIEF DESCRIPTION OF THE DRAWINGS

FIGS. 3(a) to 3(c) are schematic views each showing a state of presence or absence of a hydrogen bond in a conductive composite material according to a known embodiment and conductive composite materials according to one embodiment of the present invention.

DETAILED DESCRIPTION OF THE PREFERRED EMBODIMENTS

Hereinafter, a conductive composite material according to one embodiment of the present invention will be described in detail, but the conductive composite material of the present invention is not limited to such an embodiment.

Figure 1:
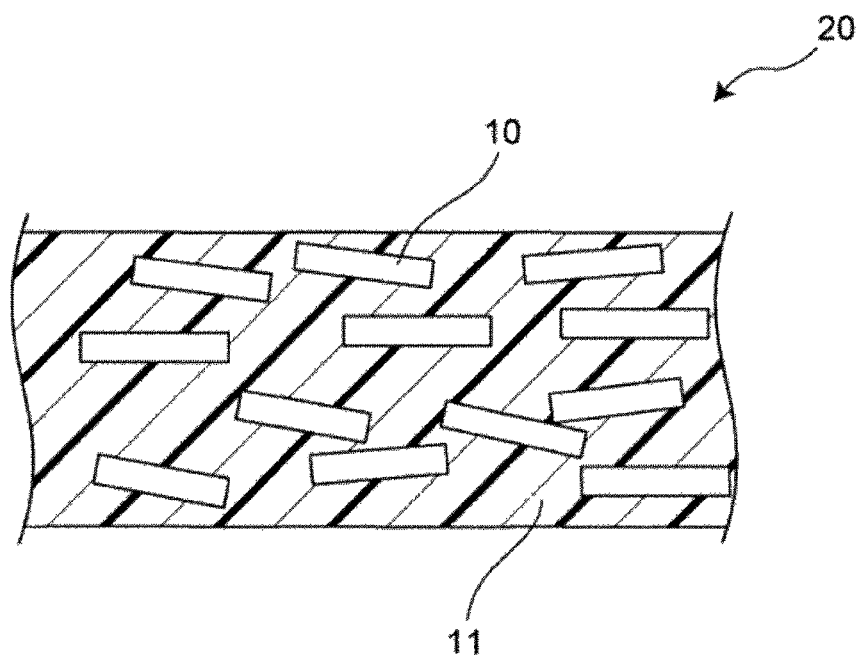
FIG. 1 is a schematic cross-sectional view showing a conductive composite material according to one embodiment of the present invention.

Referring to FIG. 1, a conductive composite material 20 of the present embodiment includes particles 10 of a predetermined layered material and a polymer material 11. The polymer material 11 has a hydrogen acceptor and a hydrogen donor, which will be described later. Hydrogen bonds are thus formed between the particles 10 of the layered material to increase the affinity between the particles 10 of the layered material and the polymer material 11, thereby increasing the electrical conductivity.

The particles 10 of the predetermined layered material in the present embodiment are MXene (particles), which are defined as follows:

particles of a layered material including one or plural layers, the one or plural layers including a layer body represented by a formula below:

$M_mX_n$ where M is at least one metal of Group 3, 4, 5, 6, or 7, and can comprise at least one selected from the group consisting of so-called early transition metals, for example, Sc, Ti, Zr, Hf, V, Nb, Ta, Cr, Mo, or Mn, X is a carbon atom, a nitrogen atom, or a combination thereof, n is not less than 1 and not more than 4, and m is more than n but not more than 5 (the layer body can have a crystal lattice in which each X is located in the octahedral array of M); and a modifier or terminal T existing on a surface of the layer body (more specifically, on at least one of both surfaces, facing each other, of the layer body), where T is at least one selected from the group consisting of a hydroxyl group, a fluorine atom, a chlorine atom, an oxygen atom, or a hydrogen atom (the layered material can be understood as a layered compound and also represented by "$M_mX_nT_x$," where x is any number and traditionally z or s may be used instead of x). Typically, n can be 1, 2, 3, or 4.

In the above formula of MXene, M is preferably at least one selected from the group consisting of Ti, Zr, Hf, V, Nb, Ta, Cr, Mo, or Mn, and more preferably at least one selected from the group consisting of Ti, V, Cr, or Mo.

Still more preferably, in the above formula of MXene, M is Ti, X is a carbon atom, or a carbon atom and a nitrogen atom. Yet still more preferably, the layer body of MXene is at least one selected from the group consisting of $Ti_3C_2$, $Ti_3CN$, or $Ti_2C$. Particularly preferably, the layer body of MXene is $Ti_3C_2T_x$ (x is any number).

Such MXene can be synthesized by selectively etching (removing and optionally layer-separating) A atoms (and optionally parts of M atoms) from a MAX phase. The MAX phase is represented by the formula below:

$M_mAX_n$ wherein M, X, n, and m are as described above, A is at least one element of Group 12, 13, 14, 15, or 16, normally an element of Group A, typically of Group IIIA and Group IVA, more specifically can comprise at least one selected from the group consisting of Al, Ga, In, Tl, Si, Ge, Sn, Pb, P, As, S, or Cd, and is preferably Al;

and has a crystal structure in which a layer composed of A atoms is located between the two layers represented by $M_mX_n$ (may have a crystal lattice in which each X is located in the octahedral array of M). When typically m=n+1, but not limited thereto, the MAX phase includes repeating units in which each one layer of X atoms is disposed in between adjacent layers of n+1 layers of M atoms (these are also collectively referred to as an "$M_mX_n$ layer"), and a layer of A atoms ("A atom layer") is disposed as a layer next to the (n+1)th layer of M atoms.

In the process of producing MXene, A atoms (and optionally parts of M atoms) are selectively etched (removed and optionally separated) from a MAX phase. As a result, the A atom layer (and optionally parts of M atoms) is removed, and the surface of the exposed $M_mX_n$ layer is modified by hydroxyl groups, fluorine atoms, chlorine atoms, oxygen atoms, hydrogen atoms, and the like, existing in an etching liquid (usually, an aqueous solution of a fluorine-containing acid is used, but not limited thereto), so that the surface is terminated. The etching can be carried out using an etching liquid containing F⁻, and a method using, for example, a mixed liquid of lithium fluoride and hydrochloric acid, a method using hydrofluoric acid, or the like may be used.

Then, the layer separation of MXene (delamination, separating multilayer MXene into single-layer MXene) may be appropriately promoted by any suitable post-treatment (for example, ultrasonic treatment, handshake, or the like). For example, in the case of obtaining a single-layer/few-layer MXene to be described later, it is preferably performed by the following method. That is, the etched product obtained by the etching is washed with water and then intercalated. As an intercalation compound used in intercalation, for example, an alkali metal compound and an alkaline earth metal compound are preferred, and a Li-containing compound is more preferred. A specific method of the intercalation is not particularly limited, and for example, the intercalation compound may be mixed with the aqueous medium clay obtained after the washing with water, and the mixture may be stirred or left to stand. Next, delamination including stirring the treated product obtained by the intercalation in a liquid such as water is performed. In the case of obtaining the single-layer/few-layer MXene, it is preferable not to perform ultrasonic treatment as delamination. After the delamination, the resulting product can be washed with water to obtain a single-layer/few-layer MXene as particles of the layered material.

MXenes whose above formula $M_mX_n$ is expressed as below are known:

$Sc_2C$, $Ti_2C$, $Ti_2N$, $Zr_2C$, $Zr_2N$, $Hf_2C$, $Hf_2N$, $V_2C$, $V_2N$, $Nb_2C$, $Ta_2C$, $Cr_2C$, $Cr_2N$, $Mo_2C$, $Mo_{1.3}C$, $Cr_{1.3}C$, $(Ti,V)_2C$, $(Ti,Nb)_2C$, $W_2C$, $W_{1.3}C$, $Mo_2N$, $Nb_{1.3}C$, $Mo_{1.3}Y_{0.6}C$ (in the above formula, "1.3" and "0.6" refer to about 1.3 (=4/3) and about 0.6 (=2/3), respectively.), $Ti_3C_2$, $Ti_3N_2$, $Ti_3(CN)$, $Zr_3C_2$, $(Ti,V)_3C_2$, $(Ti_2Nb)C_2$, $(Ti_2Ta)C_2$, $(Ti_2Mn)C_2$, $Hf_3C_2$, $(Hf_2V)C_2$, $(Hf_2Mn)C_2$, $(V_2Ti)C_2$, $(Cr_2Ti)C_2$, $(Cr_2V)C_2$, $(Cr_2Nb)C_2$, $(Cr_2Ta)C_2$, $(Mo_2Sc)C_2$, $(Mo_2Ti)C_2$, $(Mo_2Zr)C_2$, $(Mo_2Hf)C_2$, $(Mo_2V)C_2$, $(Mo_2Nb)C_2$, $(Mo_2Ta)C_2$, $(W_2Ti)C_2$, $(W_2Zr)C_2$, $(W_2Hf)C_2$, $Ti_4N_3$, $V_4C_3$, $Nb_4C_3$, $Ta_4C_3$, $(Ti,Nb)_4C_3$, $(Nb,Zr)_4C_3$, $(Ti_2Nb_2)C_3$, $(Ti_2Ta_2)C_3$, $(V_2Ti_2)C_3$, $(V_2Nb_2)C_3$, $(V_2Ta_2)C_3$, $(Nb_2Ta_2)C_3$, $(Cr_2Ti_2)C_3$, $(Cr_2V_2)C_3$, $(Cr_2Nb_2)C_3$, $(Cr_2Ta_2)C_3$, $(Mo_2Ti_2)C_3$, $(Mo_2Zr_2)C_3$, $(Mo_2Hf_2)C_3$, $(Mo_2V_2)C_3$, $(Mo_2Nb_2)C_3$, $(Mo_2Ta_2)C_3$, $(W_2Ti_2)C_3$, $(W_2Zr_2)C_3$, $(W_2Hf_2)C_3$, $(Mo_{2.7}V_{1.3})C_3$ (in the above formula, "2.7" and "1.3" refer to about 2.7 (=8/3) and about 1.3 (=4/3), respectively.)

Typically in the above formula, M can be titanium or vanadium and X can be a carbon atom or a nitrogen atom. For example, the MAX phase is $Ti_3AlC_2$ and MXene is $Ti_3C_2T_x$ (in other words, M is Ti, X is C, n is 2, and m is 3).

It is noted, in the present invention, MXene may contain remaining A atoms at a relatively small amount, for example, at 10% by mass or less with respect to the original amount of A atoms. The remaining amount of A atoms can be preferably 8% by mass or less, and more preferably 6% by mass or less. However, even if the remaining amount of A atoms exceeds 10% by mass, there may be no problem depending on the use and conditions of use of the paste (and the conductive film obtained thereby).

Figure 2A:
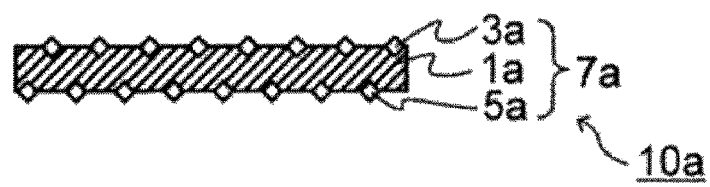
FIGS. 2(a) and 2(b) are schematic cross-sectional views each showing MXene that is a layered material that can be used in a conductive composite material according to one embodiment of the present invention.
Figure 2B:
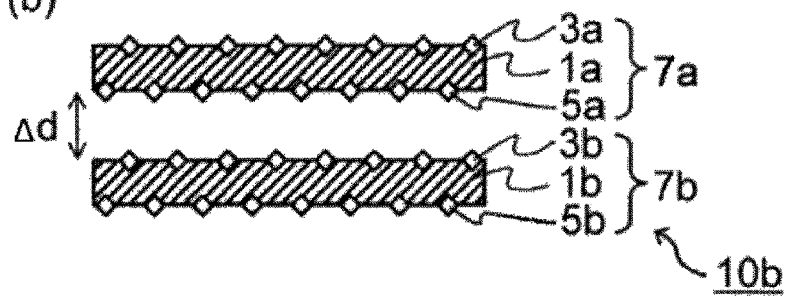

As schematically shown in FIGS. 2(a) and 2(b), the MXene (particles) 10 synthesized in this way can be a layered material containing one or plural MXene layers 7a, 7b (as examples of the MXene (particles) 10; FIG. 2(a) shows MXene 10a of one layer, and FIG. 2(b) shows MXene 10b of two layers, but is not limited to these examples). More specifically, the MXene layers 7a, 7b have layer bodies ($M_mX_n$ layers) 1a, 1b represented by $M_mX_n$, and modifiers or terminals T3a, 5a, 3b, 5b existing on the surfaces of the layer bodies 1a, 1b (more specifically, on at least one of both surfaces, facing each other, of each layer). Therefore, the MXene layers 7a, 7b are also represented by "$M_mX_nT_x$," wherein x is any number. MXene 10 may be: one that exists as one layer obtained by such MXene layers being separated from one another (single-layer structure shown in FIG. 2(a), so-called single-layer MXene 10a); a laminate made of a plurality of MXene layers being stacked to be apart from each other (multilayer structure shown in FIG. 2(b), so-called multilayer MXene 10b); or a mixture thereof. MXene 10 can be particles (which can also be referred to as powders or flakes) as a collective entity composed of the single-layer MXene 10a and/or the multilayer MXene 10b. In the present embodiment, MXene 10 is preferably particles (which can also be referred to as nanosheets), most of which are composed of the single-layer MXene 10a. In the case of the multilayer MXene, two adjacent MXene layers (for example, 7a and 7b) may not necessarily be completely separated from each other, but may be partially in contact with each other. Even when the multilayer MXene is included, the multilayer MXene is preferably MXene having a small number of layers obtained through the interlayer peeling. The "small number of layers" means, for example, that the number of stacked layers of MXene is 10 or less. Hereinafter, the "multilayer MXene having a small number of layers" may be referred to as "few-layer MXene". The thickness, in the stacking direction, of the few-layer MXene is preferably 10 nm or less. In the present specification, the single-layer MXene and the few-layer MXene are also collectively referred to as "single-layer/few-layer MXene".

Although not limiting the present embodiment, the thickness of each layer of MXene (which corresponds to the MXene layers 7a, 7b) is, for example, 0.8 nm to 5 nm, and particularly 0.8 nm to 3 nm (which can vary mainly depending on the number of M atom layers included in each layer), and the maximum dimension in a plane (two-dimensional sheet plane) parallel to the layer is, for example, 0.1 μm to 200 μm, and particularly 1 μm to 40 μm. In a case where MXene is a laminate (multilayer MXene), the inter-layer distance (or gap dimension, denoted as Δd in FIG. 2(b) in the individual laminate is, for example, not less than 0.8 nm and not more than 10 nm, particularly not less than 0.8 nm and not more than 5 nm, and more particularly about 1 nm. The total number of layers may be 2 or more, but may be, for example, 50 to 100,000, and particularly 1,000 to 20,000. The thickness in the stacking direction is, for example, 0.1 μm to 200 μm, and particularly 1 μm to 40 μm. The maximum dimension in a plane (two-dimensional sheet plane) perpendicular to the stacking direction is, for example, 0.1 μm to 100 μm, and particularly 1 μm to 20 μm. It should be noted that these dimensions are determined as number average dimensions (for example, number average of at least 40) based on photographs of a scanning electron microscope (SEM), a transmission electron microscope (TEM), or an atomic force microscope (AFM), or as distances in the real space calculated from the positions on the reciprocal lattice space of the (002) plane measured by an X-ray diffraction (XRD) method.

In the present embodiment, the polymer material mixed with the particles of the layered material includes, as a hydrogen acceptor, at least one selected from the group consisting of a fluorine atom, a chlorine atom, an oxygen atom, or a nitrogen atom, and includes, as a hydrogen donor, a hydroxyl group and/or a secondary amino group.

The present embodiment will be described with reference to FIGS. 3(a) to 3(c), which are schematic views showing a state of presence or absence of a hydrogen bond in each of the conductive composite materials. In FIGS. 3(a) to 3(c), $Ti_3C_2T_x$ is described as an example of MXene. Typically, as shown in FIG. 3(a), it is considered that due to the presence of the polymer material, a repulsive force is generated between the MXene and the polymer material to increase the inter-surface distance between MXenes, causing a decrease in electrical conductivity due to the presence of the polymer material. On the other hand, according to the present embodiment, as described above, it is considered that since the polymer material has a hydrogen acceptor and a hydrogen donor, hydrogen bonds (indicated by broken lines in FIGS. 3(b) and 3(c)) are formed between the MXene surface and the polymer material as illustrated in FIGS. 3(b) and 3(c). In particular, as illustrated in FIG. 3(c), the polymer material has both the hydrogen acceptor and the hydrogen donor, and thus more hydrogen bonds can be formed between the MXene surface and the polymer material, compared with the known case. As a result, the inter-surface distance between MXenes can be further decreased, and high electrical conductivity can be achieved while realizing an increase in film strength. More specifically, MXene necessarily includes, as a terminal, at least one selected from the group consisting of a hydroxyl group, a fluorine atom, a chlorine atom, an oxygen atom, or a hydrogen atom. Thus, when the polymer material includes, as a hydrogen acceptor, at least one selected from the group consisting of a fluorine atom, a chlorine atom, an oxygen atom, or a nitrogen atom, and includes, as a hydrogen donor, a hydroxyl group and/or a secondary amino group, it is possible to decrease the inter-surface distance between MXenes by hydrogen bonding between the MXene and the polymer material, and it is possible to achieve high electrical conductivity while realizing an increase in film strength. It is considered that, in addition to the hydrogen bond, a bond of Ti—N and C—N formed between MXene and the polymer material contributes to an improvement of affinity between the MXene and the polymer material.

Preferably, the polymer material includes one or more of a polymer having a urethane bond and a polymer having a unit derived from a (meth)acryloyl group, or a combination of one or more of these polymers and an additive having one or more of a hydroxyl group and a secondary amino group.

Examples of the polymer constituting the polymer material include polyethylenimine (PEI), polypyrrole (PPy), polyaniline (PANT), polyimide (PI) containing a secondary amino group such as flame-retardant polyimide, and examples of a polymer species having a urethane bond (—NHCO—) include polyamide imide (PAI), polyacrylamide (PMA), nylon (polyamide resin), DNA (deoxyribonucleic acid), acetanilide, and acetaminophen.

Among them, one or more of the polymer having a urethane bond and the polymer having a unit derived from a (meth)acryloyl group, as described above, are preferred as the polymer constituting the polymer material. The polymer having a urethane bond and the polymer having a unit derived from a (meth)acryloyl group have high affinity with the MXene, with which a smooth film can be formed, contributing to an improvement of electrical conductivity. As a result, both higher electrical conductivity and high strength can be achieved. The polymer material preferably includes one or more of a polymer having a urethane bond and a polymer having a unit derived from a (meth)acryloyl group, and more preferably includes a polymer having a urethane bond.

The polymer having a urethane bond is still more preferably polyurethane, and yet still more preferably one or more of a polyether-based polyurethane, a polycarbonate-based polyurethane, and a polyester-based polyurethane. The polyether-based polyurethane refers to a polyurethane containing a polyester-derived structural unit, the polycarbonate-based polyurethane refers to a polyurethane containing a polycarbonate-derived structural unit, and the polyester-based polyurethane refers to a polyurethane containing a polyester-derived structural unit. The polymer material is more preferably composed of one or more of a polyether-based polyurethane, a polycarbonate-based polyurethane, and a polyester-based polyurethane.

The polymer having a unit derived from a (meth)acryloyl group, in other words, an acrylic resin, is a polymer having a constituent unit derived from one or more of acrylic acid and methacrylic acid. The acrylic resin is more preferably an anionic acrylic resin. The acrylic resin is still more preferably an anionic acrylic resin having one or more of an alkoxymethylamide group and a hydroxyl group.

As another embodiment, the polymer material may contain a combination of the polymer and an additive having one or more of a hydroxyl group and a secondary amino group. Examples of the additives having one or more of a hydroxyl group and a secondary amino group include a surfactant having one or more of a hydroxyl group and a secondary amino group. Examples of the surfactants include tetraethylene glycol. When the polymer material includes the additive, the additive may also be a hydrogen donor in addition to the polymer. Examples of the polymer material include a combination of a polymer having a unit derived from a (meth)acryloyl group and a surfactant such as tetraethylene glycol.

The ratio of the particles of the layered material is more than 19% by volume but not more than 95% by volume. When the ratio of the particles of the layered material is more than 19% by volume, the electrical conductivity can be ensured. The ratio of the particles of the layered material is more preferably 30% by volume or more, still more preferably 35% by volume or more, and yet still more preferably 50% by volume or more from the viewpoint of further increasing the electrical conductivity. Meanwhile, from the viewpoint of ensuring the film strength of the composite material of MXene particles/polymer material, the ratio of the particles of the layered material is preferably 95% by volume or less, more preferably 75% by volume or less, and still more preferably 50% by volume or less. The ratio of the particles of the layered material refers to a ratio to the conductive composite material. The conductive composite material of the present invention may contain additives such as a colorant and an antioxidant, but in this case, the ratio of the particles of the layered material refers to a ratio to the conductive composite material containing the additives.

The conductive composite material of the present embodiment may have any shape. For example, the shape may be a shape having a thickness, such as a rectangular parallelepiped, a sphere, or a polygon, a paste, a slurry, or the like, in addition to a planar shape (sheet-like shape). The conductive composite material of the present embodiment may be a coating film formed on the surface of the base material. Even when the conductive composite material of the present embodiment is a coating film, its shape is not limited to a planar shape (sheet-like shape), and examples thereof include a form in which the conductive composite material adheres to at least a part of a surface of an object to be coated or covers the object to be coated along the shape of the object to be coated. One preferred form of the conductive composite material is a planar shape (sheet-like shape). In the case of a planar shape (sheet-like shape), it may be a shape having two main planes facing each other. The thickness of the sheet-like conductive composite material, the shape and dimensions when viewed in a planar view, and the like can be appropriately selected depending on the intended use of the conductive composite material. The conductive composite material of the present embodiment may be, for example, a paste such as a conductive paste or a slurry. Examples of the paste or slurry include a mixture of particles of a predetermined layered material and a polymer material, and further, if necessary, an aqueous medium liquid, an organic medium liquid, metal particles, ceramic particles, and the like. As the paste or slurry, the mass ratio of the particles of the layered material is, for example, 20% or more, and further 50% or more. As an example, the paste or slurry is applied to a base material or the like and the paste or slurry is dried to form a conductive film.

When the conductive composite material of the present embodiment is formed on the surface of a base material, the shape and material of the base material are not particularly limited. The shape of the base material may be, for example, a plate shape, a spherical shape, a needle shape, or an irregular shape. Examples of the material of the base material include a metal material, a ceramic material, a polymer material including a conductive polymer, and a composite material of two or more thereof. Examples of the metal material include gold, silver, copper, platinum, nickel, titanium, tin, iron, zinc, magnesium, aluminum, tungsten, molybdenum, and an alloy containing 50% by mass or more of these metals.

When the conductive composite material has the sheet-like shape described above, the thickness can be measured by, for example, observing the cross section by a method such as a micrometer, a contact-type surface shape measuring instrument, a scanning electron microscope (SEM), a microscope, or a laser microscope.

A method for producing the conductive composite material of the present embodiment using the MXene produced as described above is not particularly limited. When the conductive composite material of the present embodiment has a sheet-like form, for example, as illustrated below, the layered material and the polymer material can be mixed to form a coating film.

First, a MXene aqueous dispersion, a MXene organic solvent dispersion, or a MXene powder in which the MXene particles (particles of a layered material) are present in a solvent may be mixed with a polymer material. The solvent of the MXene aqueous dispersion is typically water, and in some cases, other liquid substances may be contained in a relatively small amount (for example, 30% by mass or less, preferably 20% by mass or less based on the whole mass) in addition to water.

The MXene particles and the polymer material can be stirred using a dispersing device such as a homogenizer, a propeller stirrer, a thin-film spin system mixer, a planetary mixer, a mechanical shaking device, or a vortex mixer.

An object such as a substrate may be coated with a slurry: a mixture of the MXene particles and the polymer material, but the coating method is not limited. Examples of the coating method include a method of spray coating using a nozzle such as a one-fluid nozzle, a two-fluid nozzle, or an air brush, a method such as slit coating, screen printing, or metal mask printing using a table coater, a comma coater, or a bar coater, and a coating method by spin coating or dropping. As the object, a printed-circuit board, a metal substrate, a resin substrate, a laminated electronic component, a metal pin, a metal wire, or the like may be appropriately employed depending on the intended use.

The coating and drying may be repeated a plurality of times as necessary until a film having a desired thickness is obtained. Drying and curing may be performed at a temperature of 400° C. or lower, for example, using a normal pressure oven or a vacuum oven.

The conductive composite material of the present embodiment preferably maintains an electrical conductivity of 280 S/cm or more when the conductive composite material is in the form of a sheet having a film thickness of 5 μm, for example, as shown in Examples described later. The electrical conductivity can maintain an electrical conductivity of preferably 1000 S/cm or more, more preferably 2000 S/cm or more, still more preferably 3000 S/cm or more, and yet still more preferably 6000 S/cm or more. The upper limit of the electrical conductivity of the conductive film is not particularly defined, but may be, for example, 25000 S/cm or less. The electrical conductivity can be measured using a resistivity meter.

The conductive composite material of the present embodiment has high electrical conductivity and high strength as described above, and thus can be utilized for any appropriate application. For example, the conductive composite material may be utilized in applications requiring to maintain high electrical conductivity (to reduce a decrease in initial electrical conductivity and prevent oxidation), such as electrodes and electromagnetic shields (EMI shields) in any suitable electrical devices.

Although the conductive composite material in one embodiment of the present invention has been described in detail above, various modifications are possible. It should be noted that the conductive composite material of the present invention may be produced by a method different from the production method in the above-described embodiment.

EXAMPLES

Example 1

Preparation of MAX Particles (Precursor of MXene Particles)

TiC powder, Ti powder, and Al powder (all manufactured by Kojundo Chemical Lab. Co., Ltd.) were placed in a ball mill containing zirconia balls at a molar ratio of 2:1:1 and mixed for 24 hours. The obtained mixed powder was calcined in an Ar atmosphere at 1350° C. for 2 hours. The calcined body (block) thus obtained was crushed with an end mill to a maximum size of 40 μm or less. Thereby, $Ti_3AlC_2$ particles were obtained as MAX particles.

Etching of Precursor and Li Intercalation

The $Ti_3AlC_2$ particles (powder) prepared by the above method were etched under the following etching conditions and Li-intercalated to obtain a solid-liquid mixture (slurry) containing a solid component derived from the $Ti_3AlC_2$ powder.

(Conditions of Etching of Precursor and Li Intercalation)
  Precursor: $Ti_3AlC_2$ (sieve with a mesh size of 45 μm)
  Composition of etching liquid: 3 g of LiF
  HCl (9M) 30 mL
  Amount of precursor charged: 3 g
  Etching container: 100 mL I-BOY
  Etching temperature: 35° C.
  Etching time: 24 h
  Stirrer rotation speed: 400 rpm Washing after Etching The slurry was divided into two portions and inserted into two 50 mL centrifuge tubes, and the tubes were centrifuged in a centrifuge at 3500 G, and then the supernatant liquid was discarded. 40 mL of pure water was added to the remaining precipitate in each of the centrifuge tubes (i), centrifugation was performed again at 3500 G (ii), and the supernatant liquid was separated and removed (iii). The operations (i) to (iii) were repeated 10 times in total. It was confirmed that the pH of the supernatant liquid in the 10th operation was more than 5, and the supernatant liquid was discarded to obtain a $Ti_3C_2T_x$-aqueous medium clay.

Delamination 40 mL of pure water was added to the $Ti_3C_2T_x$-aqueous medium clay (i), then the mixture was stirred with a shaker for 15 minutes, the mixture was centrifuged at 3500 G (ii), and the supernatant liquid was recovered as a single-layer MXene-containing liquid (iii). The operations (i) to (iii) were repeated 4 times in total to obtain a single-layer MXene-containing supernatant liquid. Further, this supernatant liquid was centrifuged in a centrifuge under the conditions of 4300 G and 2 hours, and then the supernatant liquid was discarded to obtain a single-layer/few-layer MXene-containing clay as a single-layer/few-layer MXene-containing sample.

Formation of MXene/Polyurethane Composite Film

The single-layer/few-layer MXene-containing clay, pure water, and polyurethane (Resamine D-4080 (polyether/carbonate) manufactured by Dainichiseika Color & Chemicals Mfg. Co., Ltd.) were mixed so as to obtain MXene/polyurethane composite films in which the ratios (after film formation and drying) of MXene ($Ti_3C_2T_x$) in the MXene/polyurethane composite films were 25, 50, 75, or 100% by volume, respectively. The resulting mixtures were manually stirred for 5 minutes to obtain MXene/polyurethane composite liquids.

Each of the resulting MXene/polyurethane composite liquids was sprayed onto a PET substrate ("Lumirror" (registered trademark) manufactured by Toray Industries, Inc., 15 cm square). The spraying and drying with a dryer were performed 15 times until the thickness of each of the MXene/polyurethane composite films reached 5 μm. After completion of the coating, the films were dried in a normal pressure oven at 80° C. for about 30 minutes to obtain MXene/polyurethane composite films.

Example 2

Preparation of MAX Particles (Precursor of MXene Particles)

MAX particles were obtained in the same manner as in Example 1.

Etching of Precursor

The $Ti_3AlC_2$ particles (powder) prepared by the above method were etched under the following etching conditions to obtain a solid-liquid mixture (slurry) containing a solid component derived from the $Ti_3AlC_2$ powder.

(Etching Conditions)
  Precursor: $Ti_3AlC_2$ (sieve with a mesh size of 45 μm)
  Composition of etching liquid: 6 mL of 49% HF
  $H_2O$ 18 mL
  HCl (12M) 36 mL
  Amount of precursor charged: 3.0 g
  Etching container: 100 mL I-BOY
  Etching temperature: 35° C.
  Etching time: 24 h
  Stirrer rotation speed: 400 rpm Washing after Etching The slurry was divided into two portions and inserted into two 50 mL centrifuge tubes, and the tubes were centrifuged in a centrifuge at 3500 G, and then the supernatant liquid was discarded. An operation of adding 40 mL of pure water to the remaining precipitate in each of the centrifuge tubes, performing centrifugation again at 3500 G, and separating and removing the supernatant liquid was repeated 11 times. After the final centrifugation, the supernatant liquid was discarded to obtain a $Ti_3C_2T_x$-aqueous medium clay.

Li Intercalation

Li intercalation was performed in such a manner that the $Ti_3C_2T_x$-aqueous medium clay prepared by the above method was stirred at not lower than 20° C. and not higher than 25° C. for 12 hours using LiCl as a Li-containing compound under the conditions below.

(Conditions of Li Intercalation)
  $Ti_3C_2T_x$-aqueous medium clay (MXene after washing): solid content 0.75 g
  LiCl: 0.75 g
  Intercalation container: 100 mL I-BOY
  Temperature: not lower than 20° C. and not higher than 25° C. (room temperature)
  Time: 10 h
  Stirrer rotation speed: 800 rpm Delamination 40 mL of pure water was added to the $Ti_3C_2T_x$-aqueous medium clay (i), then the mixture was stirred with a shaker for 15 minutes, the mixture was centrifuged at 3500 G (ii), and the supernatant liquid was recovered as a single-layer MXene-containing liquid (iii). The operations (i) to (iii) were repeated 4 times in total to obtain a single-layer MXene-containing supernatant liquid. Further, this supernatant liquid was centrifuged in a centrifuge under the conditions of 4300 G and 2 hours, and then the supernatant liquid was discarded to obtain a single-layer/few-layer MXene-containing clay as a single-layer/few-layer MXene-containing sample.

Formation of MXene/Acrylic Composite Film

The single-layer/few-layer MXene-containing clay, pure water, and an acrylic resin (NW-400 manufactured by Toagosei Co., Ltd., hereinafter referred to as "acryl") were mixed so as to obtain MXene/acrylic composite films in which the ratios (after film formation and drying) of MXene ($Ti_3C_2T_x$) in MXene/acrylic composite films were 25 or 83% by volume, respectively, and the resulting mixtures were stirred with a shaker (manufactured by FAST & Fluid Management, SK 550 1.1) for 15 minutes to obtain MXene/acrylic composite liquids.

Each of the resulting MXene/acrylic composite liquids was sprayed onto a PI substrate (manufactured by AS ONE Corporation, 3 cm square). The splaying and drying with a dryer were repeated 30 times to form coating films before drying. After completion of the coating, the films were dried in a normal pressure oven at 80° C. for 2 hours and further dried in a vacuum oven at 150° C. for about 15 hours to obtain MXene/acrylic composite films.

Comparative Example 1

MXene/SA composite films were obtained in the same manner as in Example 1 described above except that sodium alginate (SA) was used as a polymer material, and the ratios (after film formation and drying) of MXene ($Ti_3C_2T_x$) in MXene/sodium alginate (SA) composite films were set to 3, 12, 24, 32, 55, 73, or 10% by volume, respectively.

Comparative Example 2

MXene/PVA composite films were obtained in the same manner as in Example 1 except that polyvinyl alcohol (PVA) was used as a polymer material, and the ratios (after film formation and drying) of MXene ($Ti_3C_2T_x$) in the MXene/polyvinyl alcohol (PVA) composite films were set to 1, 13, 26, 48, 67, or 100% by volume, respectively.

<Measurement of Electrical Conductivity of Composite Film>

Figure 4:
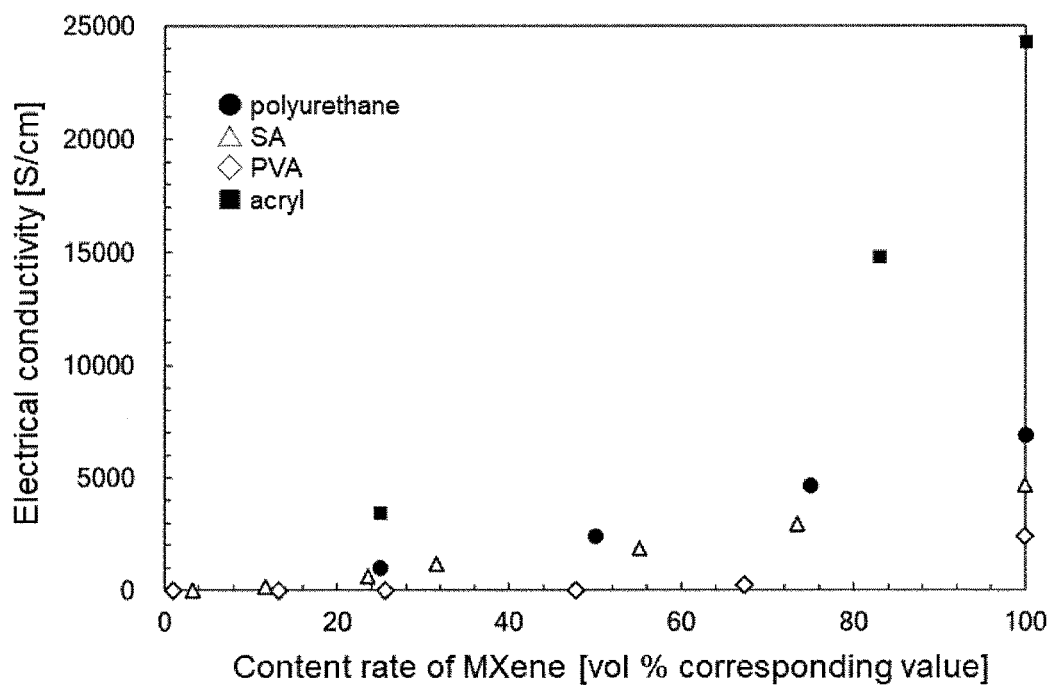
FIG. 4 is a graph showing a relationship between a content rate of MXene and the electrical conductivity of each conductive composite material.
Figure 5:
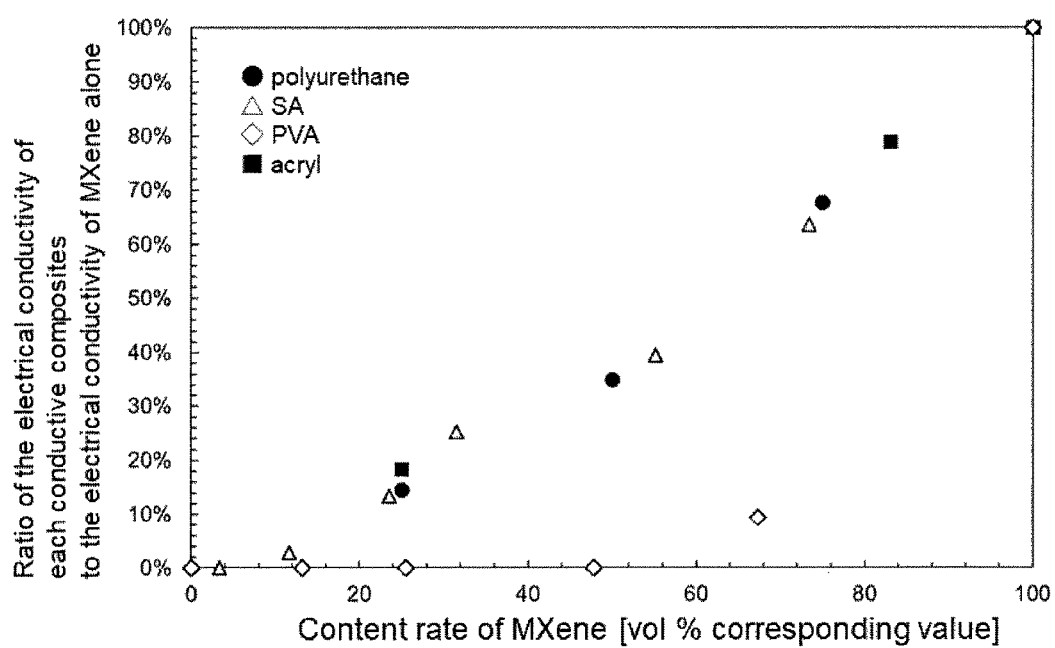
FIG. 5 is a graph showing a relationship between a content rate of MXene in each conductive composite material and a ratio of the electrical conductivity of each conductive composite material to the electrical conductivity of MXene alone.

The electrical conductivities of the resulting MXene/polyurethane composite films, MXene/acrylic composite films, MXene/SA composite films, and MXene/PVA composite films were determined. For the electrical conductivity, the resistivity ($\Omega$) and the thickness ($\mu$m) were measured at three points per sample, and the electrical conductivity (S/cm) was calculated from these measured values, and the arithmetic average value of the three electrical conductivities thus obtained was adopted. A low resistivity meter (Loresta AX MCP-T 370, manufactured by Mitsubishi Chemical Analytech Co., Ltd.) was used in the resistivity measurement. A micrometer (MDH-25 MB, manufactured by Mitutoyo Corporation) was used in the thickness measurement. The results are shown in FIG. 4. In FIG. 4, the electrical conductivity of the MXene single film varies depending on the difference in the method for producing MXene, the presence or absence and the content rate of impurities contained in the resulting composite film, and the like. Therefore, when the electrical conductivity of each of the composite films in FIG. 4 at a MXene content rate of 100% by volume (in other words, 0% by volume of the polymer material) was 100%, the ratio of the electrical conductivities at each MXene content rate were also determined. The results are shown in FIG. 5. In FIGS. 4 and 5, the MXene content rate indicates a ratio (% by volume) of MXene in each of the composite films after the film formation and drying.

In the case of the MXene/polyurethane composite films, as shown in FIG. 4, when the ratio of MXene ($Ti_3C_2T_x$) was 75% by volume, an electrical conductivity of about 4600 S/cm was obtained. As shown in FIG. 5, this electrical conductivity corresponds to 68% of the electrical conductivity of pure MXene (in other words, 100% by volume of $Ti_3C_2T_x$). Further, as shown in FIG. 5, even when the ratio of MXene ($Ti_3C_2T_x$) was as small as 25% by volume, 15% of the electrical conductivity of pure MXene (in other words, 100% by volume of $Ti_3C_2T_x$) was ensured. Although not shown in FIG. 4, when the ratio of MXene ($Ti_3C_2T_x$) was 19% by volume, an electrical conductivity of about 280 S/cm was realized.

In the case of the MXene/acrylic composite films, as shown in FIG. 4, when the ratio of MXene ($Ti_3C_2T_x$) was 83% by volume, an electrical conductivity of about 15000 S/cm was obtained. As shown in FIG. 5, this electrical conductivity corresponds to 79% of the electrical conductivity of pure MXene (in other words, 100% by volume of $Ti_3C_2T_x$). Further, as shown in FIG. 5, even when the ratio of MXene ($Ti_3C_2T_x$) was as small as 25% by volume, 18% of the electrical conductivity of pure MXene (in other words, 100% by volume of $Ti_3C_2T_x$) was ensured.

Meanwhile, in the case of the MXene/PVA composite films, as shown in FIGS. 4 and 5, even when the ratio of MXene ($Ti_3C_2T_x$) was as high as 67% by volume, the electrical conductivity was as low as 220 S/cm, and the electrical conductivity decreased to 10% or less of the electrical conductivity of pure MXene (in other words, 100% by volume of $Ti_3C_2T_x$).

On the other hand, the electrical conductivities of the MXene/PVA composite films were significantly low. Meanwhile, although the MXene/SA composite films could maintain electrical conductivity, the strength of each of the films was low as shown in Table 2 below. Cohesive fracture was confirmed in any case of the SA content rate.

<Evaluation of Strength of Composite Film>

After the electrical conductivity measurement, each of the MXene/polyurethane composite films, the MXene/acrylic composite films, and the MXene/SA composite films was subjected to a tape peeling test in the following manner. Specifically, an adhesive tape (manufactured by 3M Company, SCOTCH 600TAPE, ½ inch in width) was attached to a part of the upper surface of each of the composite films formed on a PET substrate, and then the tape was peeled off, thereby visually confirming the presence or absence of cohesive fracture of each of the composite films, in other words, separation in each film due to transfer of a part of each of the composite films to the tape-adhered surface. The evaluation results in the case of using polyurethane, acryl, and SA as the polymer material are shown in Tables 1, 2, and 3.

TABLE 1

| | Content rate of MXene [% by volume] (use of polyurethane as polymer) | | | |
|---|---|---|---|---|
| | 100 | 75 | 50 | 25 |
| Presence or absence of cohesive fracture | observed | not observed | not observed | not observed |

TABLE 2

| | Content rate of MXene [% by volume] (use of acryl as polymer) | | |
|---|---|---|---|
| | 100 | 83 | 25 |
| Presence or absence of cohesive fracture | observed | not observed | not observed |

TABLE 3

| | Content rate of MXene [% by volume] (use of SA as polymer) | | | | | | |
|---|---|---|---|---|---|---|---|
| | 100 | 73 | 55 | 32 | 24 | 12 | 3 |
| Presence or absence of cohesive fracture | observed | observed | observed | observed | observed | observed | observed |

From the results of Tables 1, 2, and 3, it was confirmed that in the MXene single film, the film was attached to both the peeled adhesive tape and the substrate, and cohesive fracture (fracture inside the film) occurred. When SA was used as the polymer material, in any case of the MXene content rate, cohesive fracture occurred, similarly to the case of the MXene single film. Meanwhile, cohesive fracture did not occur in the samples in which polyurethane or acryl was mixed as the polymer material.

The results of the measurements on the electrical conductivity and strength of the composite films described above showed that, in the present embodiment, the electrical conductivity could be ensured by adding a predetermined amount of MXene particles as the composite material of MXene particles/polymer material, and also high strength was ensured. In particular, when the ratio of the layered material (MXene) is more than 19% by volume, it can be presumed that the layered material exhibits an electrical conductivity of about 280 S/cm or more. Particularly, 68% of the electrical conductivity of the pure MXene film was ensured as the electrical conductivity of the composite material containing 75% by volume of MXene together with polyurethane. In addition, 79% of the electrical conductivity of the pure MXene film was ensured as the electrical conductivity of the composite material containing 83% by volume of MXene together with acryl. The reason why both the high electrical conductivity and the high strength was achieved is considered that as described above, the inter-surface spacing was reduced by hydrogen bonding between MXene and the polymer material, and a state in which electricity was likely to flow was maintained. It is considered that acrylic acid as a raw material of acryl used in Examples has a carboxyl group (hydroxyl group), and some carboxyl groups remain even after synthesis, that is, acryl has a certain number of hydroxyl groups.

The conductive composite material of the present invention can be used in any suitable application, and can be preferably used, for example, as electrodes or electromagnetic shields in electrical devices.

| Reference Signs List | |
|---|---|
| 1a, 1b | Layer body ($M_mX_n$ layer) |
| 3a, 5a, 3b, 5b | Modifier or terminal T |
| 7a, 7b | MXene layer |
| 10, 10a, 10b | MXene particles (particles of layered material) |
| 11 | Polymer material |
| 20 | Conductive composite material |

The invention claimed is:

1. A conductive composite material comprising:
particles of a layered material including one or plural layers, wherein the one or plural layers include a layer body represented by:

$$M_mX_n$$

where M is at least one metal of Group 3, 4, 5, 6, or 7,
X is a carbon atom, a nitrogen atom, or a combination thereof,
n is not less than 1 and not more than 4,
m is more than n but not more than 5, and
a modifier or terminal T exists on a surface of the layer body, where T is at least one selected from the group consisting of a hydroxyl group, a fluorine atom, a chlorine atom, an oxygen atom, or a hydrogen atom; and
a polymer material that includes a hydrogen acceptor that is at least one selected from the group consisting of a fluorine atom, a chlorine atom, an oxygen atom, or a nitrogen atom; and a hydrogen donor that is a hydroxyl group and/or a secondary amino group,
wherein a ratio of the particles of the layered material to the conductive composite material is more than 19% by volume but not more than 95% by volume, and
wherein the polymer material is one or more of polyethylenimine, polypyrrole, polyaniline, polyimide containing a secondary amino group, polyamide imide, polyacrylamide, nylon, deoxyribonucleic acid, acetanilide, and acetaminophen.

2. The conductive composite material according to claim 1, wherein a hydrogen acceptor of the layer body is at least one selected from the group consisting of the fluorine atom, the chlorine atom, or the oxygen atom; and a hydrogen donor of the layer body is the hydroxyl group and/or a hydrogen atom.

3. The conductive composite material according to claim 1, wherein the M is at least one selected from the group consisting of Ti, Zr, Hf, V, Nb, Ta, Cr, Mo, or Mn.

4. The conductive composite material according to claim 1, wherein the M is at least one selected from the group consisting of Ti, V, Cr, or Mo.

5. The conductive composite material according to claim 1, wherein the layer body includes at least one selected from the group consisting of $Ti_3C_2$, $Ti_3CN$, or $Ti_2C$.

6. The conductive composite material according to claim 1, wherein the ratio of the particles of the layered material to the conductive composite material is 30% by volume to 75% by volume.

7. The conductive composite material according to claim 1, wherein the conductive composite material is in a coating film form.

8. The conductive composite material according to claim 1, wherein the conductive composite material has an electrical conductivity of 280 S/cm or more.

9. A conductive composite material comprising:
particles of a layered material including one or plural layers, wherein the one or plural layers include a layer body represented by:

$$M_mX_n$$

where M is at least one metal of Group 3, 4, 5, 6, or 7,
X is a carbon atom, a nitrogen atom, or a combination thereof,
n is not less than 1 and not more than 4,
m is more than n but not more than 5, and
a modifier or terminal T exists on a surface of the layer body, where T is at least one selected from the group consisting of a hydroxyl group, a fluorine atom, a chlorine atom, an oxygen atom, or a hydrogen atom; and
a polymer material that includes a hydrogen acceptor that is at least one selected from the group consisting of a fluorine atom, a chlorine atom, an oxygen atom, or a nitrogen atom; and a hydrogen donor that is a hydroxyl group and/or a secondary amino group,
wherein a ratio of the particles of the layered material to the conductive composite material is more than 19% by volume but not more than 95% by volume, and
wherein the polymer material is one or more of a polyether-based polyurethane, a polycarbonate-based polyurethane, and a polyester-based polyurethane.

10. The conductive composite material according to claim 9, wherein a hydrogen acceptor of the layer body is at least one selected from the group consisting of the fluorine atom, the chlorine atom, or the oxygen atom; and a hydrogen donor of the layer body is the hydroxyl group and/or a hydrogen atom.

11. The conductive composite material according to claim 9, wherein the M is at least one selected from the group consisting of Ti, Zr, Hf, V, Nb, Ta, Cr, Mo, or Mn.

12. The conductive composite material according to claim 9, wherein the M is at least one selected from the group consisting of Ti, V, Cr, or Mo.

13. The conductive composite material according to claim 9, wherein the layer body includes at least one selected from the group consisting of $Ti_3C_2$, $Ti_3CN$, or $Ti_2C$.

14. The conductive composite material according to claim 9, wherein the ratio of the particles of the layered material to the conductive composite material is 30% by volume to 75% by volume.

15. The conductive composite material according to claim 9, wherein the conductive composite material is in a coating film form.

16. The conductive composite material according to claim 9, wherein the conductive composite material has an electrical conductivity of 280 S/cm or more.

* * * * *